United States Patent [19]

Kuo et al.

[11] Patent Number: 4,731,701

[45] Date of Patent: Mar. 15, 1988

[54] INTEGRATED CIRCUIT PACKAGE WITH THERMAL PATH LAYERS INCORPORATING STAGGERED THERMAL VIAS

[75] Inventors: Marco K. Kuo, San Mateo; Nirmal K. Sharma, Sunnyvale, both of Calif.

[73] Assignee: Fairchild Semiconductor Corporation, Cupertino, Calif.

[21] Appl. No.: 49,725

[22] Filed: May 12, 1987

[51] Int. Cl.$^4$ ............................................. H05K 7/20
[52] U.S. Cl. ............................ 361/388; 361/401; 361/414; 165/185
[58] Field of Search ..................... 165/80.3, 185; 174/16 HS, 68.5; 357/80, 81; 361/382, 383, 386–388, 401, 410, 412, 414

[56] References Cited

U.S. PATENT DOCUMENTS

| | | | |
|---|---|---|---|
| 3,728,584 | 4/1973 | Kuhlow | 361/388 |
| 4,616,655 | 10/1986 | Weinberg | 361/401 |
| 4,628,407 | 12/1986 | August | 361/388 |
| 4,630,172 | 12/1986 | Stenerson | 361/401 |

Primary Examiner—G. P. Tolin
Attorney, Agent, or Firm—Clifton L. Anderson

[57] ABSTRACT

An integrated circuit package includes a case incorporating an integrated circuit die. The case has several ceramic layers, including layers with apertures for defining a die cavity and two layers without apertures which serve as thermal path layers. The thermal path layers include mutually staggered vias which conduct heat from the die cavity to a heat spreader separated from the die by the thermal path layers. The vias of the two layers are not electrically coupled so that the heat spreader is thermally coupled and electrically uncoupled with respect to the die. The thermal path layers, the thermal vias and other thermal path elements are fabricated from the same set of materials used in the cavity-defining layers, electrical vias and conductive strips.

4 Claims, 5 Drawing Figures

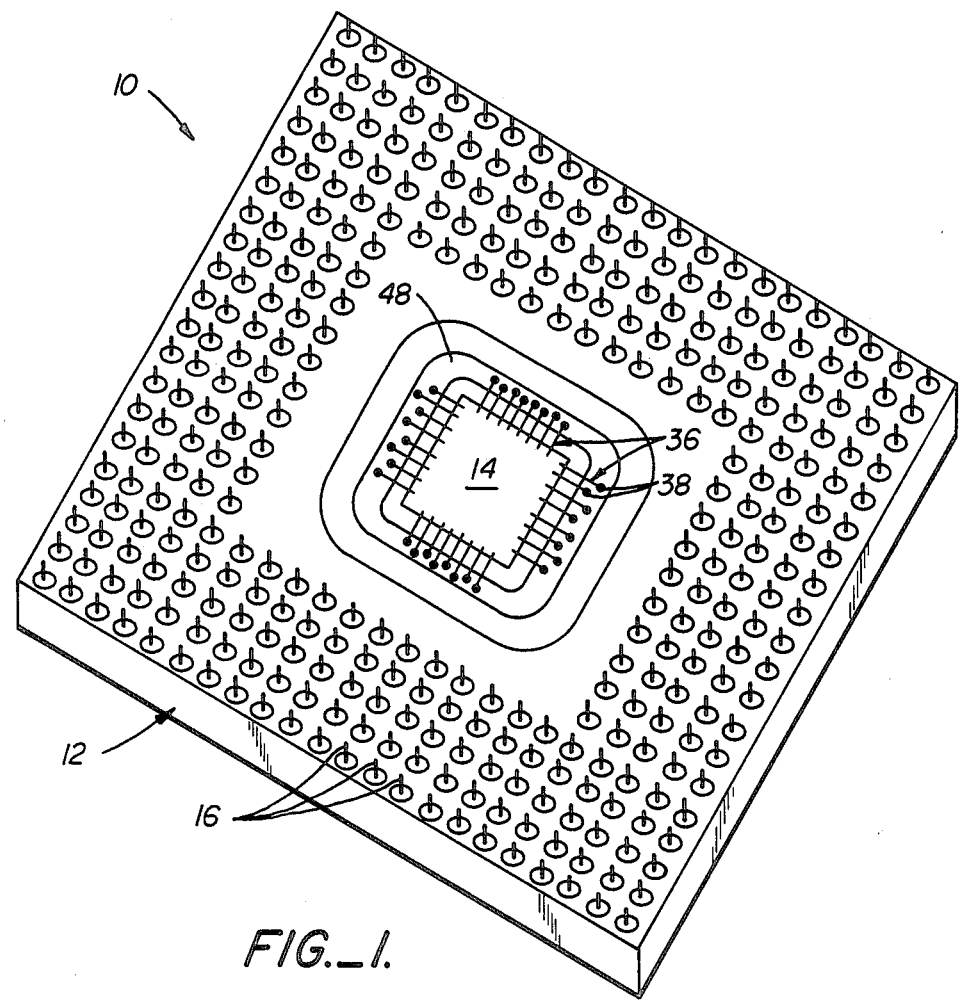
FIG._1.
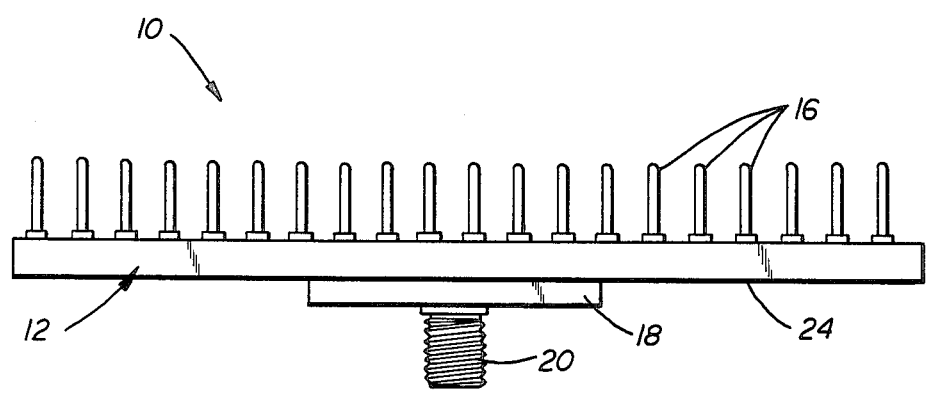
FIG._2.

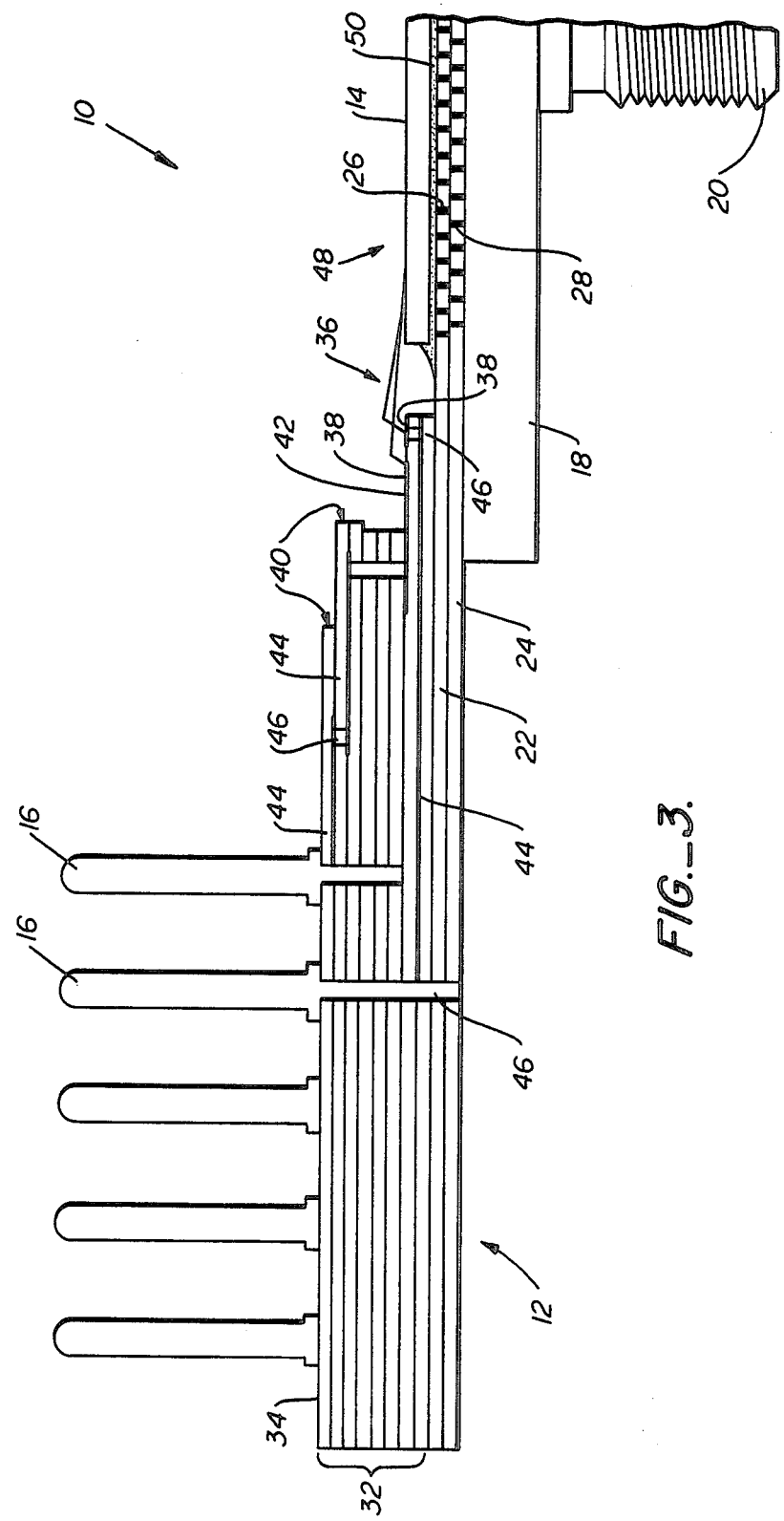
FIG._3.

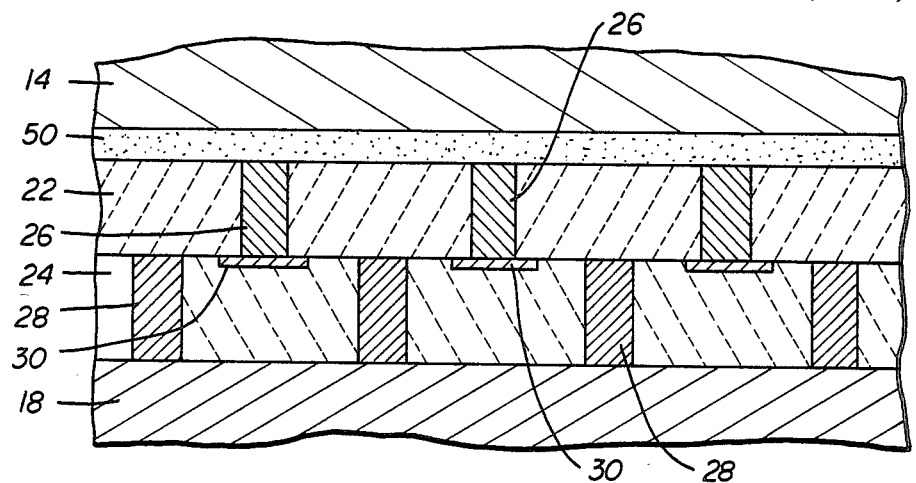
FIG._4.
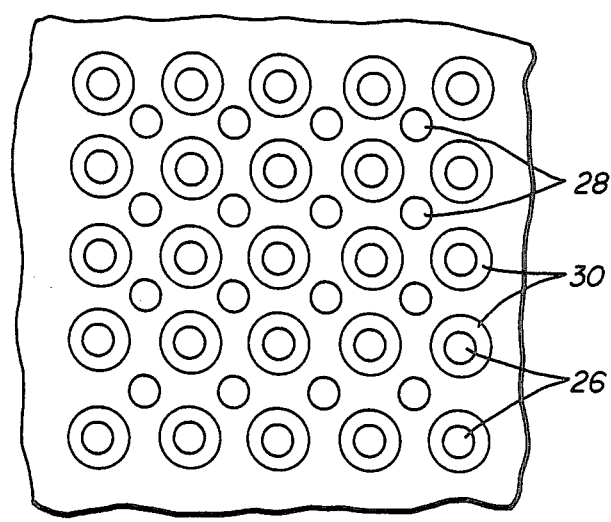
FIG._5.

INTEGRATED CIRCUIT PACKAGE WITH THERMAL PATH LAYERS INCORPORATING STAGGERED THERMAL VIAS

BACKGROUND OF THE INVENTION

The present invention relates to semiconductor packaging, and, more particularly, to a package providing an electrically insulating heat dissipation path from an incorporated integrated circuit die.

A major objective of the present invention is to provide an economical electrically insulating heat dissipation path by using essentially the same materials and processes used in fabricating the body of the semiconductor package. The invention applies, although not exclusively, to ceramic pin-grid arrays which comprise a series of laminated ceramic layers with conductive metal strips providing signal paths along layers and conductive metal vias providing signal paths through respective layers.

Integrated circuit technology has progressed rapidly in providing increased circuit density on an integrated circuit die. The increase in circuit density is correlated with an increase in heat dissipation, particularly in bipolar technology circuits. To avoid heat damage, it is important to provide a thermal path from the die to the exterior of the incorporating package.

One standard type of pin-grid array includes laminated square ceramic sheets, each sheet including centrally located square apertures which are aligned to define a cavity for an integrated circuit die. Typically, the outer square dimensions of the sheets or layers are equal, but the apertures can be different so that tiers are defined as the layers are stacked. The tiers can be used, for example, as the location of bonding pads for electrically interconnecting an incorporated integrated circuit die to the signal paths of the package itself.

The package bonding pads are electrically connected to pins of the package by conductive strips formed along layers and conductive vias formed through one of more layers. The conductive strips can be formed of gold or aluminum. The vias can be of a refractory metal such as tungsten or an alloy thereof to withstand the temperatures used in laminating the ceramic structure.

To facilitate the removal of heat from the die cavity defined by the apertured layers, a heat spreader can be disposed at the base of the cavity. Heat removal can be achieved by arranging the heat spreader as the base of the die cavity and bonding the substrate of a die directly to the heat spreader. Additional heat transfer capability can be obtained by attaching a heat sink to the heat spreader, as described in an application for U.S. patent, Ser. No. 848,358. The heat spreader is generally a refractory metal, such as a copper/tungsten alloy. The heat sink, which can be attached after formation of the package itself, can be of aluminum.

In the foregoing arrangement in the thermal path is also an electrical path, which a design advantage in many applications, and is of little significance in others. However, there are applications in which it is necessary or desirable to have the die and the heat spreader electrically isolated. Otherwise, the die and its performance are rendered vulnerable to ambient electrical fields, as well as unplanned contact with neighboring wires and components once the package is integrated into a system. The incorporating system would thus be susceptible to intermittent or permanent disruption that could be difficult to diagnose. Thus, in most cases, it is desirable to insulate the die electrically from the heat spreader and heat sink.

Electrical insulation can be provided between the heat spreader and the die cavity by imposing a ceramic layer between the two. The ceramic layer then forms the cavity base to which the die substrate is attached. The disadvantage of this approach is that the ceramic is a poor conductor of heat, so excessive heat can accumulate in the die cavity.

Another approach would be to use, instead of a ceramic layer, a layer of thermally conductive and electrically insulating material between the heat spreader and the die. Boron nitride was the electrically insulating and thermally conductive material of choice in a very different context of a rectifier package in U.S. Pat. No. 3,728,584.

In the context of ceramic integrated circuit packages, however, such a material would have to be compatible with the processing and operating constraints of the ceramic package. It would have to withstand the elevated temperatures used in forming the package itself. In addition, the thermal expansion of the material must suitably match that of the ceramic. The material would have to be suitable for attachment to the ceramic layers, the die and the heat spreader. In addition to the problem of finding a suitable electrically insulating and thermally conductive material, the costs involved in obtaining and integrating the material into the package fabrication process must be considered.

What is needed is an integrated circuit package with an economical and practical electrically insulating thermal path from the die cavity to the package exterior. Preferably, the materials used in defining this path are substantially those used in fabricating the remainder of the package.

SUMMARY OF THE INVENTION

In accordance with the present invention, an integrated circuit package has first and second insulating layers with mutually staggered patterns of thermally conductive vias. The patterned layers are interposed between a die cavity and a heat spreader to define an electrically insulating thermal path from the die cavity to the exterior of the package. The package itself can include multiple apertured cavity-defining layers with conductive strips and conductive vias defining paths from an incorporated integrated circuit die to the pin-outs of the package. Preferably the pair of layers and the vias between the die cavity and the heat spreader are fabricated of substantially the same materials as the cavity defining layers and electrical paths.

Thermal conduction between the vias of the first and second layers can be facilitated by thermally conductive collars arranged between the pair of layers. These collars can be coupled to the vias of one of the two layers and extend toward vias of the other of the two layers. Thus, the collars minimize the thermal gap between the two sets of vias while maintaining their electrical isolation.

Accordingly, an electrically insulating thermal path from an integrated circuit die cavity to the exterior of the incorporating package is provided. The desired path can be defined using only the materials employed in fabricating the remaining layers of the package. This not only simplifies manufacturing, but removes problems with bonding and mismatched thermal coefficients. These and other advantages are apparent in the context of the description below with reference to the following drawings.

BRIEF DESCRIPTION OF THE DRAWINGS

FIG. 1 is a perspective view of a pin-grid array package in accordance with the present invention.

FIG. 2 is a side elevational view of a pin-grid array of FIG. 1.

FIG. 3 is a partial sectional view of a pin-grid array package with die in accordance with the present invention.

FIG. 4 is an enlarged sectional view of a portion of the pin-grid array of FIG. 1.

FIG. 5 is an enlarged schematic plan view of the pin-grid array portion shown in FIG. 3.

DESCRIPTION OF THE PREFERRED EMBODIMENTS

In FIG. 1, an integrated circuit package 10 is shown with a ceramic case 12 and an incorporated integrated circuit die 14. Case 12 includes a large number of pins 16 adapted for engaging sockets in a system designed to utilize package 10. In FIG. 2, case 12 includes a heat spreader 18, as shown in FIG. 2, with a stud 20 for attaching a heat sink as necessary to provide additional heat transfer capability.

In FIG. 3, between die 14 and heat spreader 18 are a "die-side" ceramic layer 22 and a "spreader-side" ceramic layer 24. Die-side layer 22 has a number of vias 26 extending therethrough, and spreader-side layer 24 also has a number of vias 28 extending therethrough. Die-side vias 26 are staggered with respect to spreader-side vias 28 so that the two sets of vias are not electrically coupled. However, the spacing between a die-side via 26 and the closest spreader-side via 28 is small enough to facilitate heat transfer from layer 22 to layer 24.

In FIG. 4, thermal transfer is further facilitated by collars 30 formed on the spreader-side layer. Collars 30 minimize the amount of ceramic material in the heat path between layers 22 and 24. In FIG. 5, the radial extent of collars 30 with respect to the two sets of vias 26 and 28 is shown.

Describing package 10 in greater detail with reference to FIG. 3, case 12 has ten ceramic layers, including eight cavity-defining layers 32 and the two thermal path layers 22 and 24. Pins 16, which can be of aluminum, extend from a pin-side layer 34 away from case 12. These pins 16 are designed to engage sockets on a PC board for system integration. Pins 16 define the input and output paths for electrical signals and power between the system and integrated circuit package 10.

Die 14 is electrically coupled to case 12 by bonding wires 36 which extend from pads on die 14, as is known in the art, to bonding pads 38 on case 12. Cavity-defining layers 32 have apertures 40 of different dimensions so that a bonding tier 42 can be defined on which case bonding pads 38 are positioned. Case bonding pads 38 are coupled to respective pins 16 by conductive strips 44, which extend along respective layers 32, and by electrical vias 46 which extend through one or more cavity defining layers 32. Electrical vias 46 are of a refractory metal, e.g., tungsten, selected to withstand the processing temperatures involved with laminating the ceramic layers and to have a comparable thermal coefficient of expansion so as to reduce stress since the fabrication and operating temperatures of case 12 can vary considerably. Conductive strips 44 can be deposited, masked and etched in a conventional procedure well-known in the semiconductor processing arts. Conductive strips 44 can be of gold or aluminum, for example.

The thermal path layers 22 and 24 are similar to cavity defining layers 32 in that they are fabricated in large part of ceramic and can have conductive strips and vias for communication with pins 16. Rather than having a large square aperture, thermal path layers 22 and 24 extend over the die cavity defined by the apertures of layers 32 so as to define a base to which die 14 can be bonded with an adhesive 50. Preferably, adhesive 50 is thermally conductive. Heat spreader 18 and stud 20 must also conform to the heat requirements of the fabrication process and operating environment of package 10. Accordingly, they can be of a copper tungsten alloy. Stud 20 permits an appropriately threaded heat sink to be attached. Typically, the heat sink can be of aluminum.

It is a feature of the present invention that the thermal path layers can be fabricated of the same ceramic used to form the cavity-defining layers. It is a further feature of the present invention that the thermal vias of the thermal path layers can be fabricated of the same material used to form the electrical vias through the cavity-defining layers. In addition, it is a feature of the present invention that the collars can be of the same material as the conductive strips. Alternatively, the collars can be of the same material as the vias. In the illustrated ceramic package 10, both cavity-defining layers 32 and thermal path layers 22 and 24 of are ceramic, both electrical vias 46 and thermal vias 26 and 28 are of tungsten, and both conductive strips 44 and collars 30 are of gold.

Tests are performed comparing the illustrated embodiment to a similar package with the die attached to the heat spreader and another package with a ceramic layer between the die and the heat spreader, but without thermal vias in the ceramic. Measurements were taken of the thermal impedance between the die and the case, $\theta_{Jc}$, and between the die and the ambient air, $\theta_{Ja}$.

For the package with the via-less ceramic thermal path layer, $\theta_{Jc} = 1.3$ degrees celsius per Watt (°C./W) and $\theta_{Ja} = 6.0°$ C./W. This compares unfavorably with the more optimal performance of the package with the die attached directly to the heat spreader, $\theta_{Jc} = 0.4°$ C./W and $\theta_{Ja} = 2.38°$ C./W. The illustrated embodiment, obtaining the electrical isolation of the former while sacrificing little in the way of heat transfer, yielded the following: $\theta_{Jc} = 0.6°$ C./W and $\theta_{Ja} = 3.12°$ C./W.

Apparently, the thermal impedance of the illustrated embodiment is much closer to that of the package without an intervening ceramic layer than to that of a package with a via-less ceramic layer between the die and the heat spreader. In other words, the present invention provides electrical isolation of die 14 from heat spreader 18 with very little cost in thermal transfer.

Since the processes and materials used in the thermal path layers are those used to fabricate the rest of package case 12, the present invention imposes little in the way of additional costs or manufacturing complexity. There is little concern for the effects of differential thermal expansion during fabrication or operation that might otherwise stress and deteriorate the package.

Those skilled in the art can recognize that the present invention can be implemented in other ways. The electrical paths to the pins can be varied in innumerable ways. The integrated circuit die can be changed. The patterns of the thermal vias can be altered. The materials and processing steps can be changed. These and other modifications and variations on the illustrated embodiment are provided for by the present invention, the scope of which is limited only by the following claims.

What is claimed is:

1. A package for an integrated circuit comprising:
a plurality of cavity-defining layers of thermally and electrically insulating material with conductive strips and vias applied on and through at least some of said cavity-defining layers providing for the conduction of electrical signals, said layers including apertures so that each of said plurality of cavity-defining layers includes at least one aperture, said apertures collectively defining a die cavity;
a thermally and electrically conductive heat spreader for conducting heat from said die cavity; and
a thermally conductive electrical barrier between said plurality of layers and said heat spreader, said barrier including at least first and second layers primarily of electrically insulating material, said first and second layers being in contact, said first layer including a first pattern of thermally conductive vias extending therethrough, said second layer including a second pattern of thermally conductive vias extending therethrough, said first and second patterns being staggered so that the vias of said first and second layers define an electrically insulating thermal path between said die cavity and said heat spreader.

2. The package of claim 1 wherein the electrically insulating material of said first and second layers is substantially the same as the thermally and electrically insulating material of said cavity-defining layers.

3. The package of claim 1 wherein the vias of said first and second layers consist substantially of the same material used to form the vias of said cavity-defining layers.

4. The package of claim 1 further comprising thermally conductive collars between said first and second layers, each thermally conductive collar being in contact with exactly one of said vias of one of said first and second layers.

* * * * *